US009930766B2

(12) United States Patent
Chan et al.

(10) Patent No.: US 9,930,766 B2
(45) Date of Patent: Mar. 27, 2018

(54) APPARATUS AND METHOD FOR DETERMINING THE TYPE, DENSITY AND TEMPERATURE OF NEUTRAL RADICALS IN PLASMA

(71) Applicant: NANYANG TECHNOLOGICAL UNIVERSITY, Singapore (SG)

(72) Inventors: Chia Sern Chan, Singapore (SG); Shuyan Xu, Singapore (SG); Pavlo Rutkevych, Singapore (SG); Luxiang Xu, Singapore (SG)

(73) Assignee: NANYANG TECHNOLOGICAL UNIVERSITY, Singapore (SG)

(*) Notice: Subject to any disclaimer, the term of this patent is extended or adjusted under 35 U.S.C. 154(b) by 152 days.

(21) Appl. No.: 14/912,035

(22) PCT Filed: Jul. 30, 2014

(86) PCT No.: PCT/SG2014/000361
§ 371 (c)(1),
(2) Date: Feb. 12, 2016

(87) PCT Pub. No.: WO2015/023229
PCT Pub. Date: Feb. 19, 2015

(65) Prior Publication Data
US 2016/0198558 A1    Jul. 7, 2016

Related U.S. Application Data

(60) Provisional application No. 61/864,910, filed on Aug. 12, 2013.

(51) Int. Cl.
*H05H 1/00*    (2006.01)
*H01J 37/32*    (2006.01)
*G01N 27/62*    (2006.01)

(52) U.S. Cl.
CPC ..... *H05H 1/0037* (2013.01); *H01J 37/32954* (2013.01); *H01J 37/32972* (2013.01); *H05H 1/0081* (2013.01); *G01N 27/62* (2013.01)

(58) Field of Classification Search
CPC .......... H01J 37/32935; H01J 37/32972; H01J 37/32954; G01J 37/3299; H05H 1/0037; H05H 1/0081; G01N 27/62
See application file for complete search history.

(56) References Cited

U.S. PATENT DOCUMENTS

2005/0009347 A1    1/2005    Matsumoto et al.

FOREIGN PATENT DOCUMENTS

WO    2015023229 A1    2/2015

OTHER PUBLICATIONS

James F. Morris, Small plasma probes with guard rings and thermocouples, Oct. 1966, Nasa Technical Memorandum, pp. 1-19.*
(Continued)

*Primary Examiner* — Michael P LaPage (57) ABSTRACT

An apparatus for diagnostics of neutral radicals in plasma, the apparatus comprising: a portable probe configured to be attached to and extend into a plasma chamber to obtain information from plasma contained in the plasma chamber, the probe comprising a metallic rod configured to be biased with an alternating current voltage applied to the probe to obtain current measurements; a transparent dielectric sleeve having a large bandgap configured to allow light transmission to obtain optical emission spectra from the plasma; and an insulated thermocouple junction provided in the metallic rod, the thermocouple junction configured to measure equilibrium temperature of the probe.

12 Claims, 4 Drawing Sheets

(56) References Cited

OTHER PUBLICATIONS

P R Smy, The alternating-current Langmuir probe in a high-pressure flowing plasma, 1974, Appl. Phys, vol. 7, 1974, pp. 856-865.*
M Pedrosa, Fast movable remotely controlled Langmuir probe system, Jan. 1999, Review of Scientific Instruments, vol. 70, No. 1, pp. 415-418.*
W. E. Amatucci et al., Self-cleaning Langmuir probe, May 1993, American Institute of Physics, Rev 64, pp. 1253-1256.*
T I Cox, The use of Langmuir probes and optical emission spectroscopy to measure electron energy distribution functions in RF-generated argon plasmas, Mar. 1987, Appl. Phys. 20, pp. 820-830.*
Foreign Communication From a Related Counterpart Application, International Search Report and Written Opnion dated Oct. 27, 2014, International Application No. PCT/SG2014/000361 filed on Jul. 30, 2014.
Golan, G., et al., "Active Thermoelectric Probing," Journal of Optoelectronics and Advanced Materials, vol. 5, No. 5, 2003, p. 1417-1422.
Nisha, M., et al., "Characterization of radio frequency plasma using Langmuir probe and optical emission spectroscopy", Journal of Applied Physics, (2006), vol. 99, p. 033304-1;033304-4.

* cited by examiner

APPARATUS AND METHOD FOR DETERMINING THE TYPE, DENSITY AND TEMPERATURE OF NEUTRAL RADICALS IN PLASMA

CROSS-REFERENCE TO RELATED APPLICATIONS

The present application is a filing under 35 U.S.C. 371 as the National Stage of International Application No. PCT/SG2014/000361, filed Jul. 30, 2014, entitled "AN APPARATUS AND METHOD FOR DIAGNOSTICS OF NEUTRAL RADICALS IN PLASMA," which claims the benefit of and priority to U.S. Provisional Patent Application No. 61/864,910, filed Aug. 12, 2013, both of which are incorporated herein by reference in their entirety for all purposes.

FIELD OF THE INVENTION

This invention relates to an apparatus and method for diagnostics of neutral radicals in plasma.

BACKGROUND OF THE INVENTION

Nowadays, numerous high-technology industries, such as semiconductor processing, flat panel displays, surface enhancement, polymerization, etc., are driven to the use of plasmas with the aim of achieving better resolution, lower temperature, faster and 'greener' processing. The only drawback is that the bombardment of energetic ions onto the processing pieces, especially in plasma synthesis of thin films, results in a high density of defects, such as dangling bonds, micro-defects, etc., being formed on the surface and in the bulk of the processing pieces. However, ion bombardment is inevitable in any plasma processes. In order to suppress the ion bombardment, several remedies have been proposed, such as Capacitively Coupled Electrodeless Plasma (CCEP) and remote plasmas where a substantial percentage of ions in the plasma has been reduced resulting in a predominance of neutral radicals. For deterministic control of reactions involving neutral radicals, the type, density and energy of neutral radicals have to be obtained. To date, market-available plasma diagnostics tools, such as optical emission spectrometer (OES) and quadrupole mass spectrometer (QMS), however, are not capable of measuring all the three parameters of type, density and energy of neutral radicals.

SUMMARY OF INVENTION

A method and apparatus for diagnostics of neutral radicals in plasma are disclosed. The apparatus comprises a probe which comprises at least a transparent dielectric sleeve made of large bandgap material, such as quartz, for transmission of light from plasma, a metallic rod, such as a tungsten rod, biased by alternating current (AC) voltage for diagnostics of electron energy distribution and control of the ion and electron heating in plasma, and an insulated thermocouple junction capsulated inside the metallic rod for measurement of equilibrium temperature of the probe. Synergy of the three major components of the sleeve, the rod and the thermocouple junction allows in-situ diagnostics of the type, density and energy of neutral radicals in the plasma.

The equilibrium temperature of the probe is a result of energy balance of all heat transfer mechanisms, including heating of ions and electrons, cooling of neutral radicals, etc. By investigation of the cooling of neutral radicals under different bias potential on the probe, the temperature or average energy of neutral radicals can be measured. In addition to temperature, neutral radicals can be characterized qualitatively and quantitatively through analysis of electron impact excitation of neutral radicals from the measured optical mission spectra and electron energy distribution. The plasma probe is portable and can fit onto any plasma chamber for in-situ diagnostics of neutral radicals. It allows one-step diagnostics of type, density and energy of neutral radicals which is beneficial to deterministic control of soft plasma processing. In addition to diagnostics of neutral radicals, the probe can be potentially used in characterization of other species in the plasma such as electrons and ions.

According to a first exemplary aspect, there is provided an apparatus for diagnostics of neutral radicals in plasma, the apparatus comprising: a portable probe configured to be attached to and extend into a plasma chamber to obtain information from plasma contained in the plasma chamber, the probe comprising a metallic rod configured to be biased with an alternating current voltage applied to the probe to obtain current measurements; a transparent dielectric sleeve having a large bandgap configured to allow light transmission to obtain optical emission spectra from the plasma; and an insulated thermocouple junction provided in the metallic rod, the thermocouple junction configured to measure equilibrium temperature of the probe.

The alternating current voltage may be configured to be changeable when obtaining current measurements.

The apparatus may further comprise a vacuum manipulator configured for attaching the probe to the plasma chamber and for manipulating the position of the probe in the plasma chamber, the vacuum manipulator comprising a drive shaft configured to be connected to the probe and a number of flexible bellows connected between the drive shaft and the wall of the vacuum chamber via vacuum gaskets.

The vacuum manipulator may be configured to allow swing, rotation, forward and backward movement of the probe in the plasma chamber without affecting vacuum level of the plasma chamber.

The apparatus may further comprise a computer configured to analyse information obtained by the probe and to determine the type, density and temperature of neutral radicals in the plasma.

The computer may be further configured to calculate, from current-voltage characteristics obtained via the probe, at least one of: electron and ion currents, electro energy distribution, plasma potential, electron temperature, ion temperature, electron heating, ion heating, ohmic heating and cooling of neutral radicals.

The computer may be further configured to fit cooling of neutral radicals vs temperature of the probe linearly to determine the temperature of the neutral radicals.

The computer may be further configured to, from the optical emission spectra, identify the type of radiative radicals that exist in the plasma and to calculate the density of the neutral radicals.

According to a second exemplary aspect, there is provided a method of performing diagnostics of neutral radicals in plasma, the method comprising the steps of: obtaining current measurements from the plasma via a metallic rod of a portable probe extended into a plasma chamber containing the plasma, the metallic rod being biased with an alternating current voltage; obtaining optical emission spectra from the plasma via a transparent dielectric sleeve of the portable probe, the transparent dielectric sleeve having a large bandgap configured to allow light transmission; and measuring equilibrium temperature of the probe via an insulated thermocouple junction provided in the metallic rod.

The method may further comprise changing the alternating current voltage when performing step (a).

The method may further comprise the steps of: (d) analysing information obtained by the probe; and (e) determining the type, density and temperature of neutral radicals in the plasma.

Step (d) may further comprise calculating, from current-voltage characteristics obtained via the probe, at least one of: electron and ion currents, electro energy distribution, plasma potential, electron temperature, ion temperature, electron heating, ion heating, ohmic heating and cooling of neutral radicals.

Step (e) may further comprise fitting cooling of neutral radicals vs temperature of the probe linearly to determine the temperature of the neutral radicals.

Step (e) may further comprise, from the optical emission spectra, identifying the type of radiative radicals that exist in the plasma and calculating the density of the neutral radicals.

BRIEF DESCRIPTION OF FIGURES

In order that the invention may be fully understood and readily put into practical effect there shall now be described by way of non-limitative example only exemplary embodiments of the present invention, the description being with reference to the accompanying illustrative drawings.

DETAILED DESCRIPTION

Exemplary embodiments of the invention will be described with reference to FIGS. 1 to 9.

Figure 1:
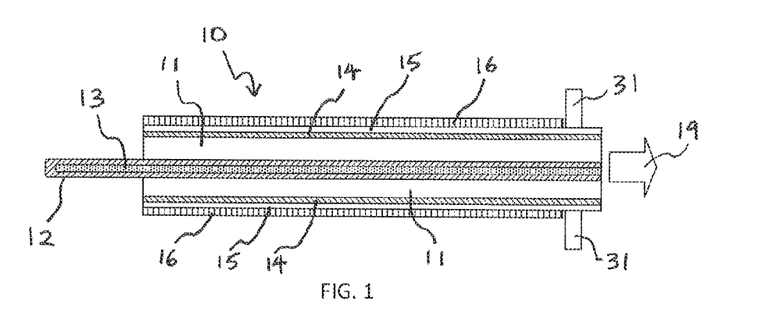
FIG. 1 is an exemplary embodiment of a portable probe.

As shown in FIG. 1, the apparatus comprises a probe 10. The probe 10 comprises a transparent dielectric sleeve 11 made of a large bandgap material for transmission of light from plasma, a metallic rod 12 biased by alternating current (AC) voltage that is configured to be changeable for diagnostics of electron energy distribution and control of ion and electron heating in plasma, and an insulated thermocouple junction 13 capsulated inside the metallic rod 12 for measurement of equilibrium temperature of the probe 10. The metallic rod 12 may be made of tungsten, and the transparent dielectric sleeve 11 may be made of quartz.

In addition to the three major components of the dielectric sleeve 11, the metallic rod 12 and the thermocouple junction 13, the probe 10 may also comprise a grounded metal sleeve 14 provided around the dielectric sleeve 11, an insulator 15 provided around the grounded metal sleeve 14, and a floating metal potential sleeve 16 provided around the insulator 14.

The grounded metal sleeve 14 is used to shield the metallic rod 12 from interference of electromagnetic field from the plasma generator (e.g. radio frequency (RF) or microwave driven power generator) and environment. This is also to provide a ground reference for current-voltage (IV) measurement. The insulator 15 separates the floating potential metal sleeve 16 from the grounded metal sleeve 14 to prevent a short circuit between them.

Figure 2:
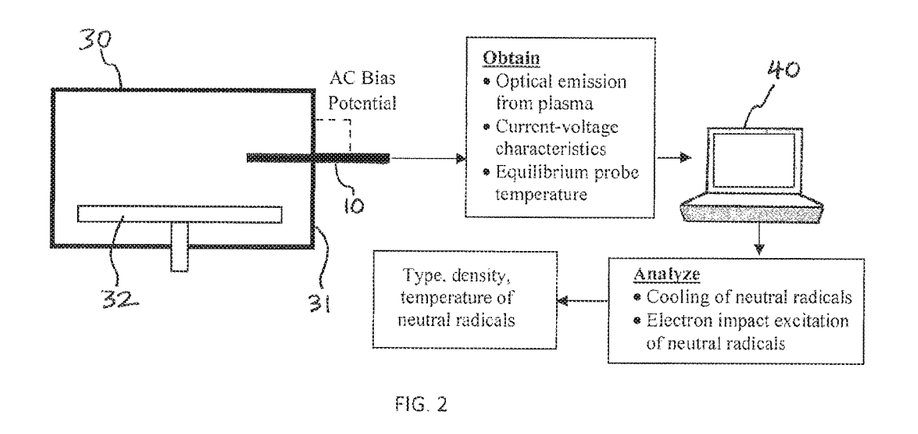
FIG. 2 is an exemplary workflow of diagnostics of neutral radicals in plasma.

As can be seen in FIG. 1, the probe 10 is configured to be attached to the wall 31 of a vacuum chamber or plasma chamber 30 as shown in FIG. 2 such that the probe 10 extends into the plasma chamber 30. Arrow 19 indicates information obtained via the probe 10 that includes optical emission from plasma, current-voltage characteristics and equilibrium probe temperature.

Synergy of the three major components 11, 12, 13 allows in-situ diagnostics or determining of the type, density and energy or temperature of neutral radicals in plasma. The equilibrium temperature of the probe 10 is a result of energy balance of all heat transfer mechanisms on the probe 10. Major mechanisms of heat transfer on the surface of the probe 10, as shown by the arrows 21 to 25 in FIG. 3, include electron heating 21, ion heating 22, ohmic heating 23, cooling of neutral radicals 24 and other heat transfer mechanisms 25 such as radiation, chemical reactions, electron emissions and so on.

By investigation of the cooling of neutral radicals under different bias potential on the probe 10 by changing the applied AC voltage, the temperature or average energy of neutral radicals can be measured, as will be described in greater detail in Example 1 below.

In addition to temperature, neutral radicals can be characterized qualitatively and quantitatively through analysis of electron impact excitation of neutral radicals from the measured optical mission spectra and electron energy distribution, as will be described in greater detail in Example 2 below.

Figure 4:
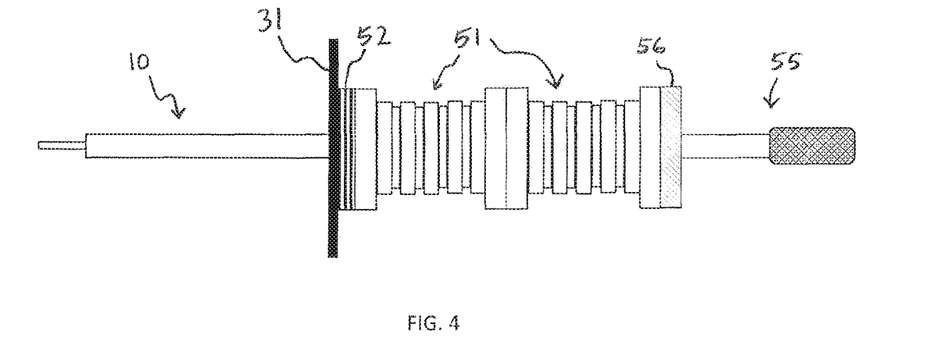
FIG. 4 is a schematic side view illustration of a vacuum manipulator.
Figure 5:
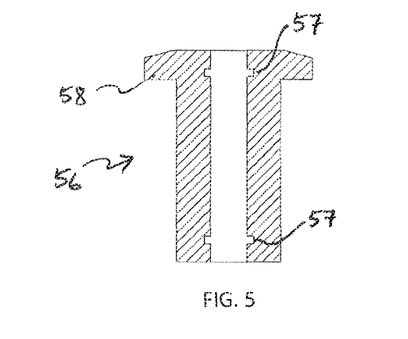
FIG. 5 is schematic cross sectional illustration of a flange of the vacuum manipulator of FIG. 4.

The plasma probe 10 is configured to be portable and, as shown in FIG. 2, can be fit onto any plasma chamber 30 for in-situ diagnostics of neutral radicals via a vacuum flange. In particular, spatial diagnostics is allowed with the use of vacuum manipulators, an example of which is shown in FIGS. 4 and 5. In one embodiment, as can be seen in FIG. 4, the plasma probe 10 is attached to the chamber wall 31 of a plasma chamber 30 through a low-cost vacuum manipulator 50 comprising a number of flexible bellows 51, a first vacuum gasket 52 provided between the chamber wall 31 and the flexible bellows 51, a drive shaft 55 configured to be connected to the probe 10 for manipulating the position of the probe 10 in the chamber 30, and a further vacuum gasket or flange 56 provided between the flexible bellows 51 and the drive shaft 55. The bellows 51, which are preferably made of metal and connected in series, serve as a flexible vacuum flange that allows large-degree swing of the drive shaft 55 and the plasma probe 10. The flange 56 is provided internally with grooves 57 for embedding o-rings therein to serve as linear and rotary feedthrough for the drive shaft 55 which passes through the flange 56. The flange 56 preferably comprises a rim 58 configured to be connected tightly to the first bellow 51 adjacent the drive shaft 55 via any vacuum gasket.

This configuration allows free movement of the drive shaft 55 and the plasma probe 10, including swing, rotation, forward and backward movement of the plasma probe 10 in the vacuum chamber 30 to an extent without affecting the vacuum level so that spatial diagnostics of neutral radicals in the plasma in the plasma chamber 30 can be achieved. In addition to diagnosing the distribution of neutral radicals in the plasma chamber 30, the transport of the neutral radicals onto the processing pieces on the holder 32 (shown in FIG. 2) in the plasma chamber 30 via concentration and temperature gradients can be characterized. Hence, quality and rate of neutral radical processing can be deterministically controlled.

In use, as shown in the schematic illustrated flowchart of FIG. 2, the method 100 thus comprises obtaining information 102 via the plasma probe 10 that is fitted onto a plasma chamber 30, the information including optical emission from the plasma, current-voltage characteristics and the equilibrium probe temperature, analysing the obtained information 104 via a computer 40 to determine cooling of neutral radicals and electron impact excitation of neutral radicals, and thereby determine the type, density, and temperature of neutral radicals 106 in the plasma.

Example 1: Diagnostics of Temperature of Neutral Radicals in the Plasma

As mentioned above, the plasma probe 10 is portable and can be fit onto any plasma chamber 30 via a vacuum flange for diagnostics of temperature of neutral radicals in the plasma. To do so, the probe 10 is biased by AC voltage for diagnostics of electron energy distribution and control of the ion and electron heating in the plasma, as shown in the exemplary circuit of FIG. 6. Under thermal equilibrium, the energy balance equation of all the heat-transfer mechanisms on the probe surface (as shown in FIG. 4) is given in Equation 1 below:

$$c_{probe}\frac{\partial T_{probe}}{\partial t} = Q_{ion} + Q_{electron} + Q_{ohm} - Q_{neutral} + Q_{other} = 0 \quad \text{(Eq. 1)}$$

where $c_{probe}$ is the specific heat capacity per unit area of the probe 10, $T_{probe}$ is the equilibrium temperature of the probe 10 which can be measured by the embedded thermocouple junction, $Q_{neutral}$ is the heat lost from the probe 10 to the neutral radicals (i.e. cooling of the neutral radicals), $Q_{electron}$ and $Q_{ion}$ are the heat transfer to the probe 10 from energetic electron and ions respectively, $Q_{ohm}$ is the ohm heating due to current flow through the probe 10, and $Q_{other}$ corresponds to other heat transfer mechanism such as radiation, chemical reactions, electron emission, etc.

Figure 3:
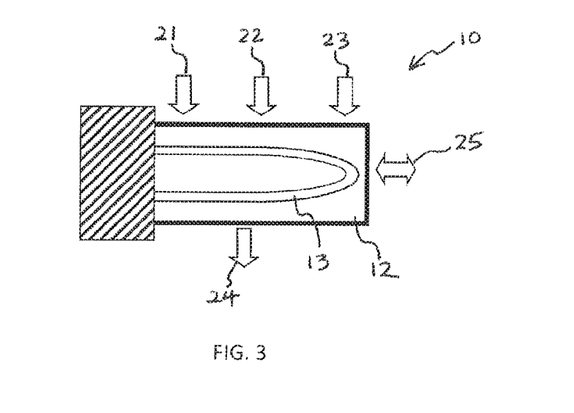
FIG. 3 is a schematic illustration of heat transfer mechanisms on a surface of the probe.

For simplicity, four major heat-transfer mechanisms are focused upon, i.e. cooling of neutral radicals 24, electron heating 21, ion heating 22 and ohmic heating 23 as shown in FIG. 3. In the Knudsen-layer approximation, heat lost from the probe 10 to neutral radicals is dependent on the temperature of the probe 10 and the neutral radicals themselves, as given by Equation 2 below:

$$Q_{neutral} = Q_{electron} + Q_{ion} + Q_{ohm} = \gamma \frac{(T_{probe} - T_{neutral})}{\sqrt{T_{neutral}}} \quad \text{(Eq. 2)}$$

where $T_{neutral}$ is the temperature of the neutral radicals.

By changing the AC bias potential ($V_{probe}$) applied onto the probe 10, transport of charged particles (i.e. electrons and ions) toward the probe leading to changes in $Q_{electron}$, $Q_{ion}$ and $Q_{ohm}$ can be independently controlled, as given by Equations 3 to 6 below:

$$Q_{ion} = \frac{I_{ion}}{A_{probe}}(V_{plasma} - V_{probe} + \varepsilon_{ion} + T_{ion}) \quad \text{(Eq. 3)}$$

$$Q_{electron} = \frac{I_{electron}}{A_{probe}}(V_{plasma} - V_{probe} + T_{electron}) \quad \text{(Eq. 4)}$$

$$Q_{ion} = \frac{R_{probe}}{A_{probe}}(|I_{ion}| - |I_{electron}|)^2 \quad \text{(Eq. 5)}$$

$$I_{probe} = I_{ion} + I_{electron} \quad \text{(Eq. 6)}$$

where $I_{probe}$ is the current measured by the probe 10 corresponding to the voltage applied ($V_{probe}$), $I_{ion}$ and $I_{electron}$ are the ion and electron current collected respectively, $V_{plasma}$ is the plasma potential, $R_{probe}$ is the resistance of the probe 10, $A_{probe}$ is the surface area of the probe 10, $T_{electron}$ is the temperature of the electrons, $T_{ion}$ is the temperature of the ions, and $\varepsilon_{ion}$ is the ionization energy of the ions, which energy is released in the process of recombination at the surface of the metallic rod that is exposed to the plasma.

These parameters can be derived from the current-voltage characteristics of the probe 10.

Under different bias potential or AC voltage, the probe temperature and $Q_{neutral}$ (which can be roughly measured from the summation of $Q_{ion}$, $Q_{electron}$ and $Q_{ohm}$ according to the energy balance) will change according to the change in electron and ion heating (due to change in the AC voltage), but the temperature of neutral radicals will still remain constant. The $Q_{neutral}$ can be fitted linearly by the probe temperature $T_{probe}$ as given by Equation 7 below, and the temperature of the neutral radicals $T_{neutral}$ can be calculated by taking the negative ratio of the vertical axis intercept ($I_{nt}$) to the gradient ($G_{rad}$), as shown in Equations 8 to 10 below.

$$Q_{electron} + Q_{ion} + Q_{ohm} = G_{rad}T_{probe} + I_{nt} \quad \text{(Eq. 7)}$$

$$G_{rad} = \frac{\gamma}{\sqrt{T_{neutral}}} \quad \text{(Eq. 8)}$$

$$I_{nt} = -\gamma\frac{T_{neutral}}{\sqrt{T_{neutral}}} \quad \text{(Eq. 9)}$$

$$T_{neutral} = -\frac{I_{nt}}{G_{rad}} \quad \text{(Eq. 10)}$$

Figure 6:
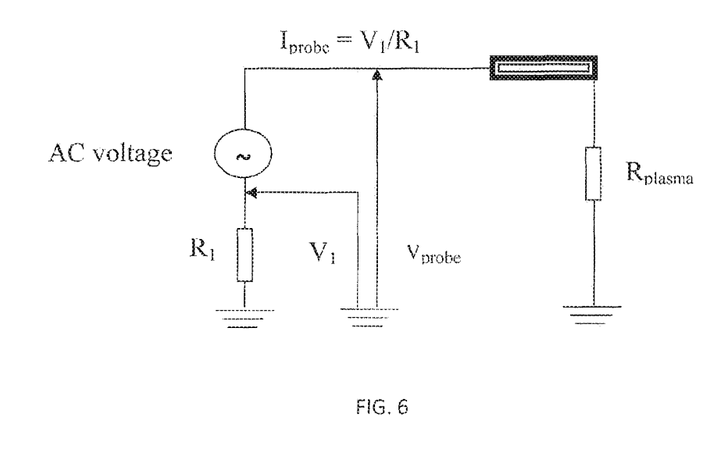
FIG. 6 is an exemplary circuit schematic for current-voltage measurement of the probe.

An exemplary workflow for measurement of the temperature of neutral radicals in the plasma 70 as described above is shown in FIG. 7. In the first step 71, a saw-tooth voltage $V_{probe}$ is applied to the plasma probe 10 and a current $I_{probe}$ is measured through a resistance $R_1$ (as shown in FIG. 6) to measure the current $I_{probe}$ from voltage measurement across it (using Ohm's law). Meanwhile, an equilibrium temperature $T_{probe}$ of the probe 10 is obtained via the embedded thermocouple 13 of the probe 10.

Figure 7:
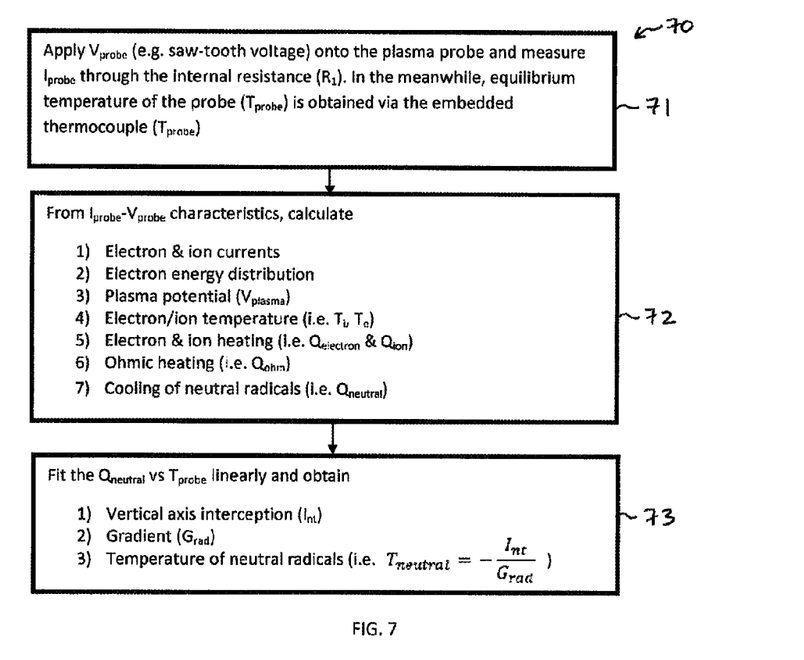
FIG. 7 is an exemplary workflow for determining temperature of neutral radicals in plasma.

In the second step 72, from the characteristics of $I_{probe}$-$V_{probe}$, the following are calculated:
Electron and ion currents
Electron energy distribution
Plasma potential ($V_{plasma}$)
Electron/ion temperature (i.e. $T_{ion}$, $T_{electron}$)
Electron and ion heating (i.e. $Q_{electron}$ and $Q_{ion}$)
Ohmic heating (i.e. $Q_{ohm}$)
Cooling of neutral radicals (i.e. $Q_{neutral}$)

In the third step 73, $Q_{neutral}$ vs $T_{probe}$ is fitted linearly to obtain the following:
Vertical axis interception ($I_{nt}$)
Gradient ($G_{rad}$)
Temperature of neutral radicals ($T_{neutral}$), as given by equation 10 above

Figure 8:
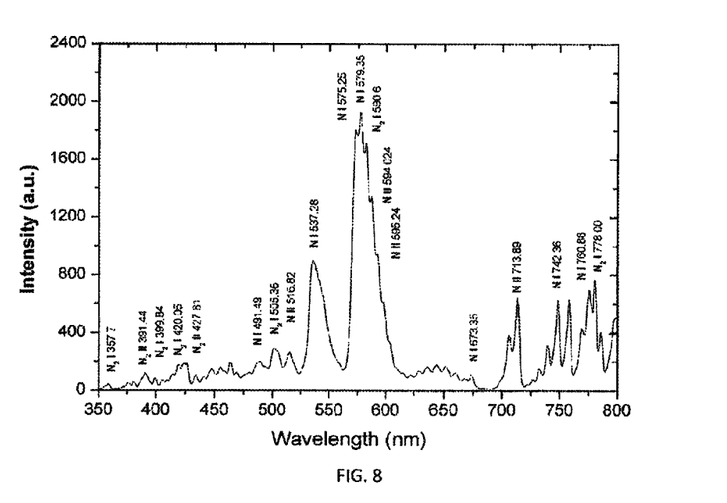
FIG. 8 is a graph of typical optical emission spectra observed in nitrogen plasma using the probe.

Example 2: Diagnostics of Type and Density of Neutral Radicals in the Plasma In plasmas, a variety of excited radicals are produced primarily by electron impact reactions in specific electron energy, branching ratio and probability and exhausted via recombination to a lower energy state with emission of photons of specific energy. The transparent dielectric sleeve 11 of the plasma probe 10 has a large bandgap and allows light transmission from the plasma to a charge couple device (CCD) or monochromater (not shown) for analysis of the transition state of radicals via optical emission spectra guiding the identification of each radiative radical. As shown in FIG. 6, a typical optical emission spectra is observed in nitrogen plasma using the plasma probe 10 having a quartz sleeve 11. In FIG. 8, N I represents neutral nitrogen radicals and N II represents single-ionized nitrogen radicals.

The peak intensity ($I_\lambda$) reflects only the radiation amount from the radiative radicals but not the total density of the corresponding neutral radicals. In order to characterize quantitatively the density of neutral radicals, the electron impact reactions which are related to the peak intensity ($I_\lambda$) can be investigated using Equations 11 and 12 below:

$$I_\lambda = \alpha_{\lambda,A} n_A \quad \text{(Eq. 11)}$$

$$\alpha_{\lambda,A} = k_B(\lambda) \int_\alpha^\infty Q_A \sigma_{\lambda,A}(v_R) v_R f_e(v_R) 4\pi v_R^2 dv_R \quad \text{(Eq. 12)}$$

where
$f_e$ is the electron velocity distribution function,
$v_R$ is the relative velocity of the electrons with respect to the radical A,
$n_A$ is the density of the radicals,
$k_D$ is the response constant of the photodetector,
$Q_A$ is the quantum yield for photon emission from the excited states, and
$\sigma_{\lambda,A}$ is the cross section of collision of the particles for emission of the photon of specific wavelength ($\lambda$).

Figure 9:
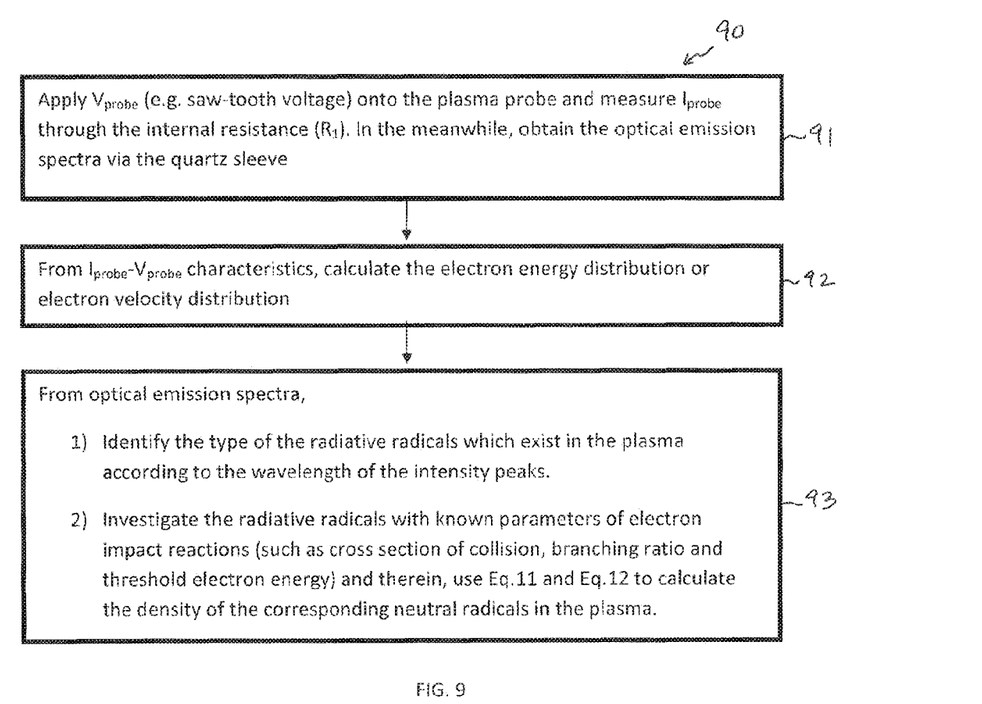
FIG. 9 is an exemplary workflow for determining type and density of neutral radicals in plasma.

An exemplary working flow for the characterization of the type and density of neutral radicals in the plasma 90 is shown in FIG. 9. In the first step 91, a saw-tooth voltage $V_{probe}$ is applied to the plasma probe 10 and a current $I_{probe}$ is measured through the resistance $R_1$ (as shown in FIG. 6) to measure the current $I_{probe}$ from voltage measurement across it (using Ohm's law). Meanwhile, optical emission spectra is obtained via the transparent dielectric sleeve 11. In the second step 92, from the characteristics of $I_{probe}$-$V_{probe}$, electron energy distribution or electron velocity distribution is calculated. In the third step 93, from the optical emission spectra obtained via the sleeve 11, the following is performed:

identify the type of radiative radicals which exist in the plasma according to the wavelength of the intensity peaks,
investigate the radiative radicals with known parameters of electron impact reactions, such as the cross section of collision, branching ratio and threshold electron energy, and use Equations 11 and 12 above to calculate the density of the corresponding neutral radicals in the plasma.

Using the apparatus 10 and method 100 of the present invention, real time in-situ deterministic diagnostics and control of neutral radicals can thus be performed. There is great demand for this in plasma-based manufacturing industries (such as chips and circuits, solar cells, flat panel displays, cutting tools, polymers, etc.), especially in soft-plasma processing where energetic ions are suppressed leading to predominance of the neutral radicals, to:
understand the underlying plasma reactions
monitor the stability and uniformity of the plasma during plasma processing
facilitate plasma recipe transfer can be also based on the plasma parameter measured by the probe
shorten the time for development of new processes Whilst there has been described in the foregoing description exemplary embodiments of the present invention, it will be understood by those skilled in the technology concerned that many variations in details of design, construction and/or operation may be made without departing from the present invention. For example, besides tungsten another metal such as stainless steel, gold, copper, or molybdenum may be used for the biased metallic rod 12. Besides quartz, another suitable material glass or corundum may be used for the transparent dielectric sleeve 11 having a large bandgap.

The invention claimed is:

1. An apparatus for diagnostics of neutral radicals in plasma, the apparatus comprising:
a portable probe configured to be attached to and extend into a plasma chamber to obtain information from plasma contained in the plasma chamber, the probe comprising
a metallic rod configured to be biased with an alternating current voltage applied to the metallic rod to obtain current measurements;
a transparent dielectric sleeve having a bandgap configured to allow light transmission to obtain optical emission spectra from the plasma;
an insulated thermocouple provided in the metallic rod, the thermocouple configured to measure equilibrium temperature of the probe; and
a computer configured to analyse information obtained by the probe and to determine the type, density and temperature of neutral radicals in the plasma.

2. The apparatus of claim 1, wherein the alternating current voltage is configured to be changeable when obtaining current measurements.

3. The apparatus of claim 1, further comprising a vacuum manipulator configured for attaching the probe to the plasma chamber and for manipulating the position of the probe in the plasma chamber, the vacuum manipulator comprising
a drive shaft configured to be connected to the probe and
a number of flexible bellows connected between the drive shaft and the wall of the vacuum chamber via vacuum gaskets.

4. The apparatus of claim 3, wherein the vacuum manipulator is configured to allow swing, rotation, forward and backward movement of the probe in the plasma chamber without affecting vacuum level of the plasma chamber.

5. The apparatus of claim 1, wherein the computer is further configured to calculate, from current-voltage characteristics obtained via the probe, at least one of: electron and ion currents, electro energy distribution, plasma potential, electron temperature, ion temperature, electron heating, ion heating, ohmic heating and cooling of neutral radicals.

6. The apparatus of claim 5, wherein the computer is further configured to fit cooling of neutral radicals vs temperature of the probe linearly to determine the temperature of the neutral radicals.

7. The apparatus of claim 1, wherein the computer is further configured to, from the optical emission spectra, identify the type of radiative radicals that exist in the plasma and to calculate the density of the neutral radicals.

8. A method of performing diagnostics of neutral radicals in plasma, the method comprising:
   (a) obtaining current measurements from the plasma via a metallic rod of a portable probe extended into a plasma chamber containing the plasma, the metallic rod being biased with an alternating current voltage;
   (b) obtaining optical emission spectra from the plasma via a transparent dielectric sleeve of the portable probe, the transparent dielectric sleeve having a bandgap configured to allow light transmission; and
   (c) measuring equilibrium temperature of the probe via an insulated thermocouple provided in the metallic rod; and
   (d) determining the type, density and temperature of neutral radicals in the plasma from information obtained by the probe.

9. The method of claim 8, further comprising changing the alternating current voltage when performing step (a).

10. The method of claim 8, wherein step (d) further comprises calculating, from current-voltage characteristics obtained via the probe, at least one of: electron and ion currents, electro energy distribution, plasma potential, electron temperature, ion temperature, electron heating, ion heating, ohmic heating and cooling of neutral radicals.

11. The method of claim 10, wherein step (d) further comprises fitting cooling of neutral radicals vs temperature of the probe linearly to determine the temperature of the neutral radicals.

12. The method of claim 8, wherein step (d) further comprises, from the optical emission spectra, identifying the type of radiative radicals that exist in the plasma and calculating the density of the neutral radicals.

* * * * *